Figure 1:
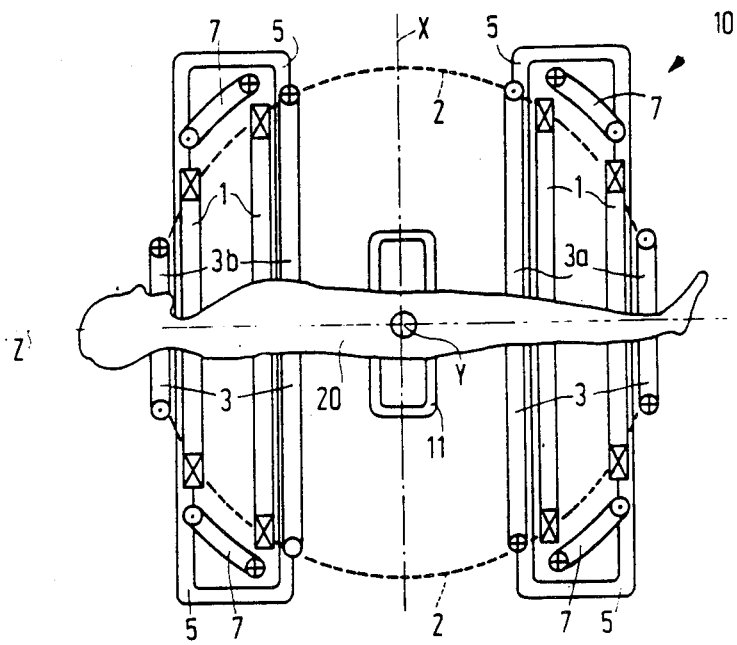

United States Patent [19]
Den Boef

[11] Patent Number: 4,706,023
[45] Date of Patent: Nov. 10, 1987

[54] METHOD OF REDUCING ARTEFACTS IN IMAGES FORMED BY MEANS OF FOURIER ZEUGMATOGRAPHY

[75] Inventor: Johannes H. Den Boef, Eindhoven, Netherlands

[73] Assignee: U.S. Philips Corporation, New York, N.Y.

[21] Appl. No.: 821,652

[22] Filed: Jan. 23, 1986

[30] Foreign Application Priority Data

May 22, 1985 [NL] Netherlands .................... 8501459

[51] Int. Cl.$^4$ ............................................. G01R 33/20
[52] U.S. Cl. .................................... 324/309; 324/313
[58] Field of Search ............... 324/300, 306, 307, 308, 324/309, 311, 313, 318, 322

[56] References Cited

U.S. PATENT DOCUMENTS

| | | | |
|---|---|---|---|
| 4,214,202 | 7/1980 | Bonori | 324/314 |
| 4,593,248 | 6/1986 | Hyde et al. | 324/300 |
| 4,621,235 | 11/1986 | Van Uijen | 324/309 |

Primary Examiner—Michael J. Tokar
Attorney, Agent, or Firm—Paul R. Miller

[57] ABSTRACT

NMR images formed by means of Fourier zeugmatography contain disturbing artefacts which are caused by coherent interference signals (for example, off-set signals, non-ideal 180° reversing pulses). In accordance with the invention, an additional phase difference ($\Delta\phi = \pi$ in the case of even rows, and $\Delta\phi = \pi \cdot (m-1)/m$ rad/sec in the case of m odd rows) is generated and the signal samples taken from the resonance signals are stored in adjacently situated rows of an image frequency matrix. The values in every second row of the matrix are changed to cancel said additional phase-difference, so that the contributions of the coherent interference signals to the matrix are influenced by the additional phase shift; if the additional phase shift is $\pi$ rad/sec, the values of every second row of interference signals in the direction of the columns are simply inverted. During Fourier transormation of the columns, therefore, the artefacts caused by the interference signals are shifted towards the border of the image.

18 Claims, 8 Drawing Figures

METHOD OF REDUCING ARTEFACTS IN IMAGES FORMED BY MEANS OF FOURIER ZEUGMATOGRAPHY

The invention relates to a method of determining a nuclear magnetic resonance distribution in a region of a body which is situated in a generated, steady, uniform magnetic field, including the steps of (a) generating a high-frequency electromagnetic pulse in order to cause a precessional motion of the magnetization of nuclei in the body, thus generating a resonance signal, (b) then applying at least one gradient magnetic field during a preparation period, (c) then taking a number of signal samples of the resonance signal during a measurement period, (d) then repeating a measurement cycle comprising the steps (a), (b) and (c) for a plurality of repetitions, the integral of the intensity of a least one gradient field over the preparation period having a different value at each repetition in order to provide a set of signal samples in a matrix consisting of (m) rows and (n) columns from which, after Fourier transformation thereof, an image of the distribution of the induced nuclear magnetization is determined.

The invention also relates to a device for determining the nuclear magnetic resonance distribution in a region of the body, comprising:

(a) means for generating a steady, uniform magnetic field, (b) means for generating high-frequency electromagnetic radiation, (c) means for generating at least one gradient magnetic field, (d) sampling means for sampling, during a measurement period, a resonance signal generated by the means specified in paragraphs(a) and(b), after conditioning the resonance signal during a preparation period, (e) processing means for processing the signals provided by the sampling means, and (f) control means for controlling at least the means specified in paragraphs (b) to (e) for generating, conditioning, sampling and processing a plurality of resonance signals, each resonance signal being respectively conditioned during a preparation period.

Herein, nuclear magnetic resonance distribution is to be understood to mean the nuclear spin density distribution, a flow velocity distribution, a relaxation time $T_1$, $T_2$ distribution as well as a nuclear spin resonance frequency spectrum distribution (N.M.R. location-dependent spectrocopy), etc.

Such a method (also referred to as Fourier zeugmatography) and device are known from German Patent Application No. DE-OS 26.11.497. According to such a method, a body to be examined is subjected to a strong, steady, uniform magnetic field Bo whose field direction coincides with, for example the z-axis of a cartesian coordinate system (x, y, z). The steady magnetic field Bo causes a slight polarization of the nuclear spins present in the body and enables a precessional motion of nuclear spings to occur about the direction of the magnetic field Bo. After the application of the magnetic field Bo, a preferably 90° pulse of high-frequency electromagnetic radiation is generated (with an angular frequency $\omega = \gamma \cdot B_o$, in which $\gamma$ is the gyromagnetic ratio and Bo is the intensity of the magnetic field) in order to rotate the direction of magnetization of the spin nuclei present in the body through an angle (90°). After the termination of the 90° pulse, the nuclear spins will start to perform a precessional motion about the field direction of the magnetic field Bo, thus generating a resonance signal (FID signal). Using the gradient magnetic field $G_x$, $G_y$, $G_z$ whose field directions all coincide with that of the magnetic field Bo, a total magnetic field $B = B_o + G_x \cdot x + G_y \cdot y + G_z \cdot z$ can be generated whose intensity is location-dependent, because the intensity of each gradient magnetic field $G_x$, $G_y$, $G_z$ has a respective gradient in the x-, the y- and the z- direction.

After the 90° pulse a field $G_x$ is applied for a period $t_x$ and subsequently a field $G_y$ for a period $t_y$, so that the precessional motion of the excited nuclear spins is modified in a location-dependent manner. After this preparation phase (i.e. after $t_x + t_y$), a field $G_z$ is applied and the FID signal (actually the sum of all magnetizations of the nuclei) is sampled at $N_z$ measurement instants during a period $t_z$. The described measurement procedure is subsequently repeated $1 \times m$ times, different values being used on each occasion for $t_x$ and/or $t_y$. Thus, $(N_z \times m \times 1)$ signal samples are obtained which contain the information concerning the magnetization distribution in a region of a body in the x, y, z space. The $1 \times m$ measured $N_z$ signal samples are stored in a memory (in $N_z \times m \times 1$ memory locations), after which an image of the distribution of the nuclear magnetic resonance is obtained by 3-D Fourier transformation of the signal samples of the FID signals. It will be apparent that it is alternatively possible, using selective excitation, to generate the FID signal from the nuclear spins only in a 2-dimensional plane (having an orientation which can be selected at random), so that for example an FID signal need only be generated m times in order to obtain an image of the magnetization distribution at $m \times N_z$ points in the selected plane by means of a 2-dimensional Fourier transformation.

Using the described method, a nuclear spin density distribution is determined in a 2-D plane or a 3-D volume. Using a similar method, it is possible to determine, for example, for each pixel in a plane or volume, a frequency spectrum which represents the metabolic (chemical) state of the matter in the region corresponding to the relevant pixel. To achieve this, for example so gradient field should be applied during the measurement period, whilst 1, 2 or 3 gradient fields should be applied during the preparaiton period. Using such a method, a 2, 3 or 4-dimensional matrix is filled with signal samples which are converted into location-dependent frequency spectra after a 2-D, 3-D or 4-D Fourier transformation, the location-dependency then being in 1, 2, or 3 dimensions (for example x, or x, y or x, y, z).

The images of the nuclear magnetic resonance distribution obtained by means of the 2-D, 3-D or multidimensional NMR Fourier zeugmatography as described above, however, contain artefacts which disturb the information present in the NMR image or which even (partly) cancel this information. The NMR images are obtained by performing a (2-D, 3-D, etc.) Fourier transformation on the demodulated resonance signals which consist of low-frequency signals having a frequency f in a range $0 </f/< f_{max}$. The image artefacts are usually due to undesired signals in this frequency range. A first type of artefact becomes apparent as a pixel at the centre of the image which has a different density and is caused by off-set voltages, etc. A further type of artefact is formed by a second image which is superposed on the first image. Artefacts of this kind occur when non-ideal 180° pulses are used when employing so-called spin echo technique. Such artefacts are referred to hereinafter as being caused by ccoherent interference signals. Due to these coherent interference signals, acctually two types of information are intermingled; this is of course extremely annoying and undesirable. One solution to the problem of removing such artefacts is to perform two measurements with respect to each signal sample in the matrix, the excitation phase of the resonance signal during the first measurement being opposite to that during the second measurement. Subtraction of the two signal samples then compensates for the errors appearing, thus reducing the artefacts. However, such a solution requires a measurement which takes twice as long and is, therefore, undesirable.

It is an object of the invention to provide a method and a device for forming NMR images which are not disturbed by artefacts (even when spin echo NMR techniques are used) and in which the time required for taking the signal samples is not longer than in the known method and devices in which the occurrence of artefacts is not avoided.

To achieve this, a method in accordance with the invention is characterized in that during a plurality of measurement cycles the steady, uniform magnetic field is amplitude modulated, such that between the resonance signals associated with the various rows in the matrix which succeed one another with respect to the value of the integral of the intensity of the gradient field over the preparation period there is each time introduced the same phase difference ($\Delta\phi$), the additional phase differences thus introduced being cancelled before Fourier transformation of values present in columns of the matrix.

A version of a method in accordance with the invention is characterized in that the number of rows of the matrix is even, the additional phase difference $\Delta\phi$ being equal to $\pi$ rad/sec, before Fourier transformation of values present in columns of the matrix either the values present in the odd rows or in the even rows being inverted in order to cancel the additional phase difference.

As a result of the use of the proposed method the following is achieved: the signal samples obtained during the measurement cycles are stored in a matrix, the row position ( the row index number) of the number of (n) signal samples to be stored in a row being determined by the sequence of values of the integral of the intensity of the gradient magnetic field over the preparation period in the various measurement cycles. A coherent interference signal, for example an off-set signal, which is generated by the electronic circuits required for the detection and sampling of the resonance signal will occur in the same sense for each signal sample. However, when signal samples are taken from every second row of a resonance signal which has been set in phase opposition, the effect of the coherent interference signals, after inversion of every second row, will reverse its sign each time from one row to the next row. Consequently, after Fourier transformation over the columns of the matrix, the effect will occur only in the edge elements of the columns of the image matrix, because the interference signals whose sign changes for each successive row will contain the highest frequency occurring in the matrix. As a result of bringing successive resonance signals in opposite phases, therefore, the contribution of the off-set voltage to the central pixel (frequency 0) will be shifted to the edge of the image due to the Fourier transformation; this has a substantially less disturbing effect. It is to be noted that the alternating coherent interference signals are converted into a known point spread function by the Fourier transformation, the position of the maximum of said function being determined by the number of values in the columns. When this number is even, the maximum of the point spread function will be situated at one side of the column in the outermost column element. In all other column elements the value of the p.s.f. will be zero. When a column contains an odd number of values, the outermost elements situated on both sides of the column will receive a highest contribution from the p.s.f. after Fourier transformation. The successive neighbouring elements will receive an encreasingly smaller contribution as the distance from the outermost element increases (becoming a minimum for the central element of the column).

When the spin echo NMR technique is used, 180° excitation pulses are applied in order to generate a spin echo resonance signal. The 180° pulse rotates the phase of spins through 180°. However, when non-ideal 180° pulses are used, the excitation of the spins will not be ideal and some of the spins will assume a phase other than the intended phase. Moreover, undesired spins will also be put in the desired phase, because the 180° exitation pulse is coherent with the 90° excitation pulse. The undesirably excited nuclear spins make a signal contribution which is superposed on the desired resonance signal; after Fourier transformation, this leads to undesired image information which is mixed with the desired image information in an image thus obtained.

By introducing said phase differences ($\Delta\phi$) and by eliminating these phase differences before Fourier transformation in accordance with the invention, the coherent interference signal generated by the undesirably excited nuclear spins will, after inversion of the signal samples in every second row of the matrix, be shifted to the edge of the image thus obtained by Fourier transformation over the columns. It is to be noted that for the most effective reduction of image artefacts caused by non-ideal 180° pulses, the preparatory gradient magnetic field is preferably generated during the period between the 90° excitation pulse and the 180° pulse.

The invention can also be used for performing three-dimensional Fourier zeugmatography. A version of a method of determining a nuclear magnetic resonance distribution in a three-dimensional region of a body which is situated in a generated, steady, uniform magnetic field includes the steps of:

(a) generating a high-frequency electromagnetic pulse in order to cause a precessional motion of the magnetization of nuclei in the body, thus generating a resonance signal, (b) then applying, during a preparation period, at least a first and a second preparatory gradient magnetic field whose field directions are mutually perpendicular, (c) then taking, during a measurement period, a set of signal samples of the resonance signal, (d) then repeating a measurement cycle comprising the steps (a),(b) and (c) for a plurality of repetitions, a first integral which comprises the integral of the intensity of the first gradient field over the preparation period having a first number of different values whilst a second integral which comprises the integral of the intensity of the second gradient field over the preparation period has a second number of different values in order to provide a set of signal samples in a three-dimensional matrix which consists of lines, rows and columns, one plane thereof containing rows and columns, per measurement cycle at least one row of a plane being filled, from said matrix there being determined, after Fourier transformation thereof, an image of the distribution of the induced nuclear magnetization in a three-dimensional region of a body, and is characterized in that the steady, uniform magnetic field is amplitude modulated during successive measurement cycles so that between the resonance signals associated with the different planes in the matrix which succeed one another with respect to the value of the integral of the intensity of the first gradient field over the preparation period and between the resonance signals associated with the different rows in a plane of the matrix which succeed one another with respect to the value of the integral of the intensity of the second gradient field over the preparation period there is invariably introduced a first and a second additional phase difference ($\Delta\phi_1$, $\Delta\phi_2$), the introduced first and second additional phase differences ($\Delta\phi_1$, $\Delta\phi_2$) being cancelled before Fourier transformation of values present in columns or lines of the matrix.

When such an additional phase difference is introduced in the resonance signals from one row to another during the filling of a matrix, after 3-D Fourier transformation the image artefacts will then be shifted to the edge of the outermost plane (when the number of planes and the number of rows are even numbers) or will be spread out in the outermost rows on both sides of the outermost plane (when the number of planes is even and the number of rows is odd).

A device in accordance with the invention is characterized in that it includes further means for generating an amplitude-modulated uniform magnetic field, the control means including programmed computer means for generating and applying control signals to the means for generating an amplitude-modulated uniform magnetic field. Using such a device, the described methods can be performed without giving rise to said artefacts, as has already been explained.

Figure 2:
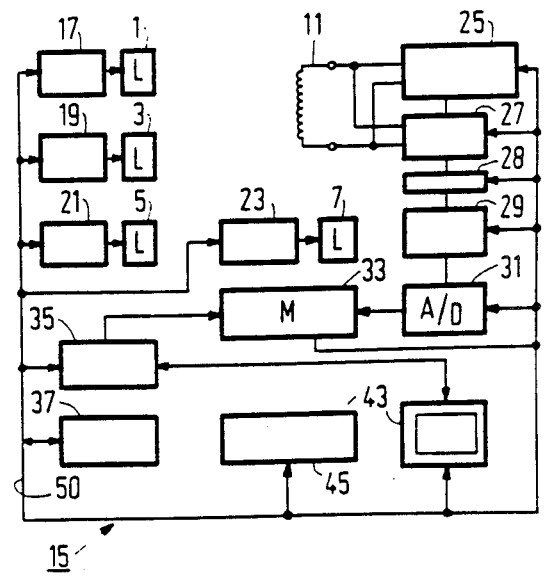
Figure 3:
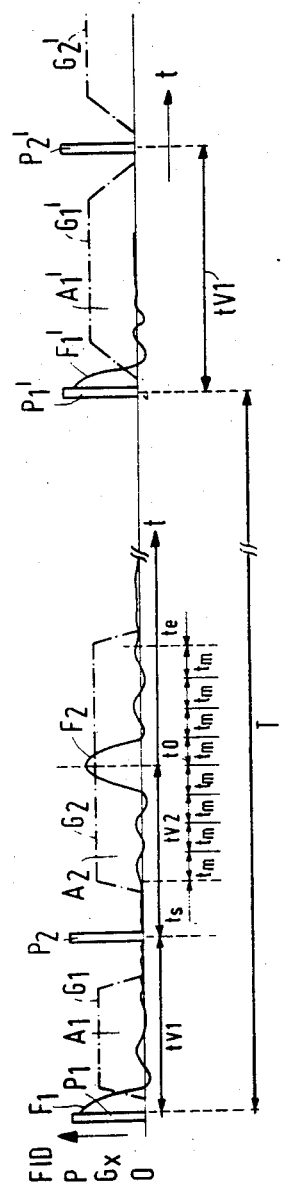
Figure 4:
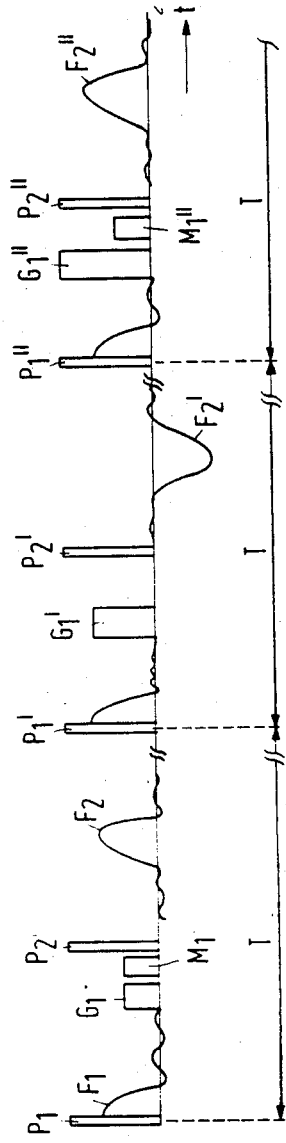
Figure 5:
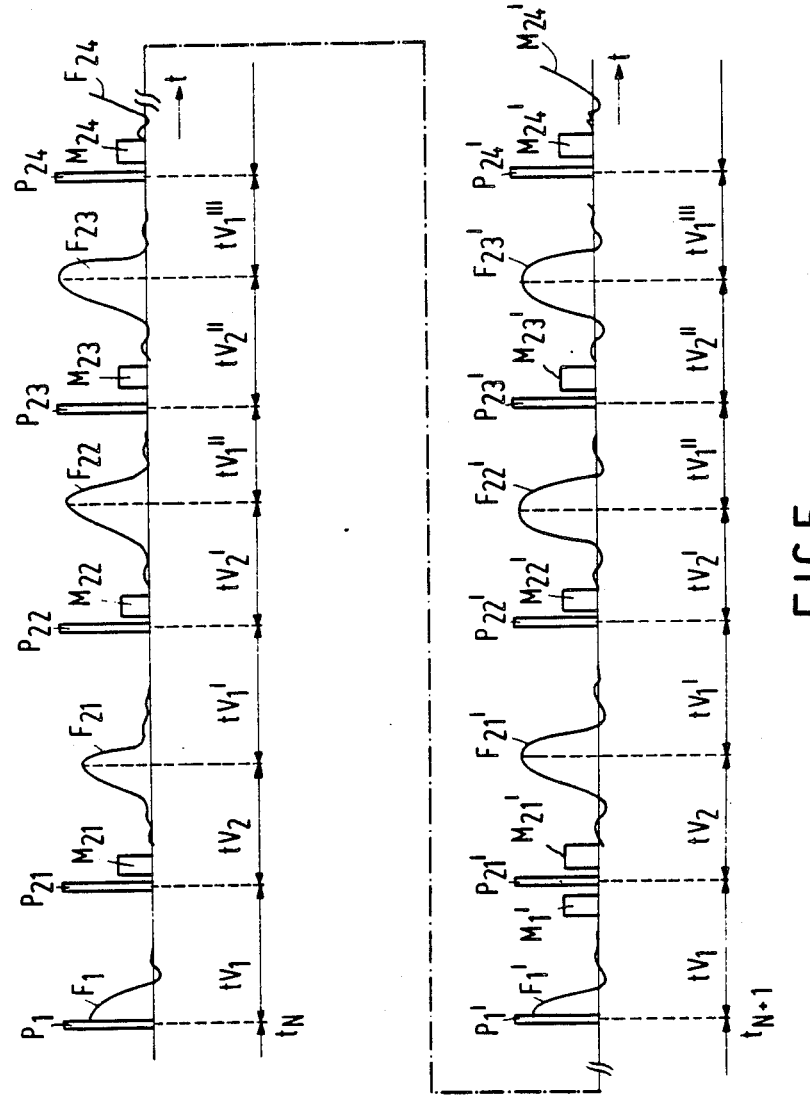
Figure 6:
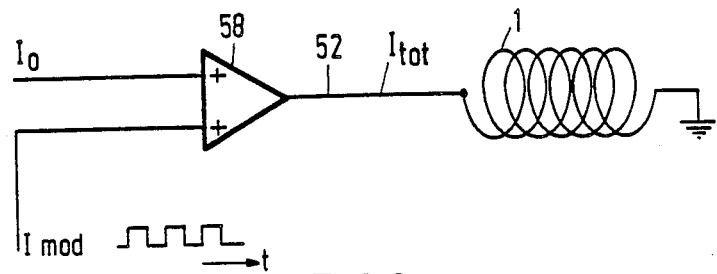
Figure 7:
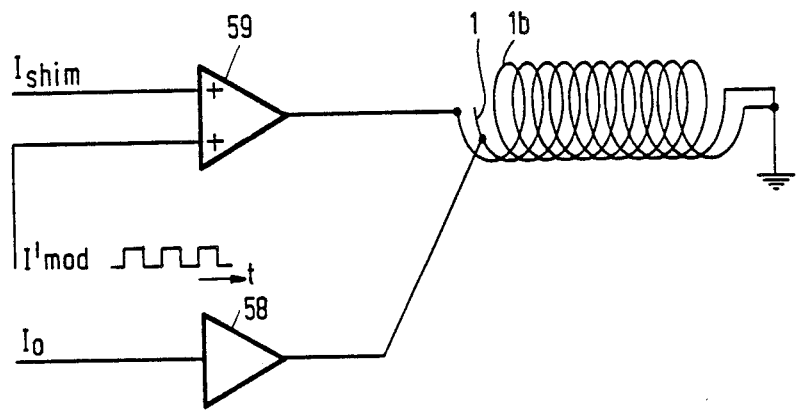
Figure 8:
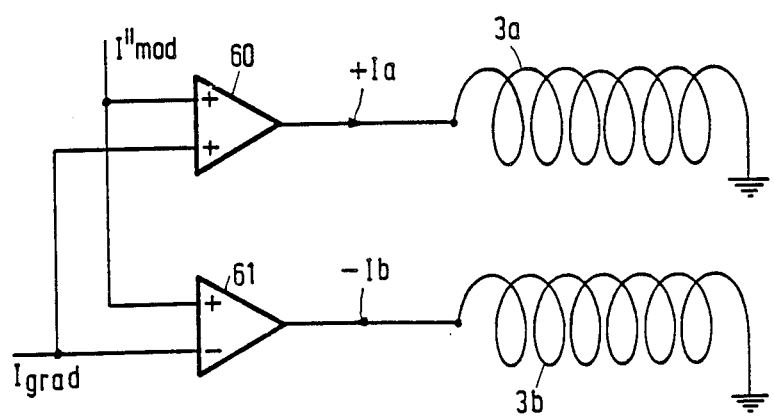

The invention will be described in detail hereinafter with reference to embodiments shown in the accompanying drawing; therein FIG. 1 shows diagrammatically a configuration of a coil system of a device for performing a method in accordance with the invention;

FIG. 2 shows a block diagram of a device for performing the method in accordance with the invention, FIG. 3 illustrates a simple version of a method in accordance with the state of the art, FIG. 4 illustrates a version of a method in accordance with the invention, FIG. 5 illustrates a further version of a method in accordance with the invention, FIG. 6 shows a part of a device in accordance with the invention, FIG. 7 shows an embodiment of a part of the device shown in FIG. 2, and FIG. 8 shows a further embodiment of a part of the device shown in FIG. 2.

FIG. 1 shows a coil system 10 which forms part of a device 15 (FIG. 2) used for determining an NMR distribution of spin nuclei in a region of a body 20. This region has a thickness of, for example, $\Delta z$ and is situated in the x-y plane of the coordinate system x-y-z shown. The y-axis of the system extends upwardly perpendicularly to the plane of drawing. The coil system 10 generates a uniform, steady magnetic field Bo, having a field direction parallel to the z-axis, three gradient magnetic fields $G_x$, $G_y$ and $G_z$, having a field direction parallel to the z-axis and a gradient direction parallel to the x-, y- and z-axis, respectively, and a high-frequency magnetic field. To achieve this, the coil system 10 comprises a set of main coils 1 for generating the steady uniform magnetic field Bo having an intensity of from 0.1 to 2.5 Tesla. The main coils 1 may be arranged, for example on the surface of a sphere 2 whose centre is situated at the origin 0 of the cartesian coordinate system x, y, z shown, the axes of the main coils being coincident with the z-axis.

The coil system 10 furthermore comprises, for example four coils $3_a$, $3_b$ which are arranged on the same spherical surface and which generate the gradient magnetic field $G_z$. To achieve this, a first set $3_a$ is excited by a current in the opposite sense with respect to the current in the second set $3_b$; this is denoted by $\oplus$ and $\odot$ in the FIGURE. Therein, $\odot$ means a current entering the section of the coil 3 and $\oplus$ means a current leaving the section of the coil.

The coil system 10 comprises, for example four rectangular coils 5 (only two of which are shown), or four other coils such as, for example "Golay" coils, for generating the gradient magnetic field $G_y$. In order to generate the gradient magnetic field $G_x$ use is made of four coils 7 which have the same shape as the coils 5 and which have been rotated through an angle of 90° about the z-axis with respect to the coils 5. FIG. 1 also shows a coil 11 for generating and detecting a high-frequency electromagnetic field.

FIG. 2 shows a device 15 for performing a method in accordance with the invention. The device 15 comprises coils 1, 3, 5, 7 and 11 which have already been described with reference to FIG. 1, current generators 17, 19, 21 and 23 for exciting the coils 1, 3, 5 and 7, respectively, and a high-frequency signal generator 25 for exciting the coil 11. The device 15 also comprises a high-frequency signal detector 27, a demodulator 28, a sampling circuit 29, processing means such as an analog-to-digital converter 31, a memory 33 and an arithmetic circuit 35 for performing Fourier transformations, a control unit 37 for controlling the sampling instants and also a display device 43 and the central control means 45 whose functions and relationships will be described in detail hereinafter.

The device 15 described above performs a method of determining the NMR distribution of spin nuclei in a body 20 as will be described hereinafter. The method involves the frequent repetition of a measurement cycle which itself can be divided into several steps. During a measurement cycle, some of the spin nuclei present in the body are resonantly excited. For the resonant excitation of the spin nuclei the current generator 17 is switched on by the central control unit 45 so that the coil is energized and remains energized during the subsequent measurement cycles, thus generating a steady and uniform magnetic field Bo. Furthermore, the high-frequency generates 25 is switched on for a brief period of time, so that the coil 11 generates a high-frequency electromagnetic field (r.f. field). The spin nuclei in the body 20 can be excited by the applied magnetic fields, the excited nuclear magnetization then taking up a given angle, for example 90° (90° r.f. pulse) with respect to the uniform magnetic field Bo. The location in the body region and the element whose spin nuclei will thus be excited will depend inter alia on the intensity of the field Bo, on any gradient magnetic field applied, and on the angular-frequency $\omega_o$ of the high-frequency electromagnetic field, because the equation $\omega_o=\gamma\cdot$Bo (1) has to be satisfied, in which $\gamma$ is the gyro-magnetic ratio (for free protons, for example H$_2$O protons, $\gamma/2\cdot\pi=42,576$ MHz/T). After an excitation period the high-frequency generator 25 is switched off by the central control means 45. The resonant excitation is always performed at the beginning of each measurement cycle. For some methods of operation, r.f. pulses are also induced in the body during the measurement cycle. These r.f. pulses can be, for example 180° r.f. pulses or a series composed of 180° r.f. pulses which are periodically induced into the body. The latter is referred to as "multiple spin echo". Spin echo techniques are inter alia described in the article by I. L. Pykett "NMR in Medicine", published in Scientific American, May 1982.

During a next step usable sampling signals are collected. For this purpose use can be made of the gradient fields which are generated by the generators 19, 21 and 23, respectively, under the control of the central control means 45. The detection of the resonance signal (referred to as FID signal) is performed by switching on the high-frequency detector 27, the modulator 28, the sampling circuit 29, the analog-to-digital converter 31 and the control unit 37. This FID signal appears as a result of the precessional motion of the nuclear magnetization about the field direction of the magnetic field $\overline{B}o$ due to the r.f. excitation pulse. This nuclear magnetization induces an induction voltage in the detection coil whose amplitude is a measure of the amount of nuclear magnetization.

The analog sampled FID signals originating from the sampling circuit 29 are digitized (converter 31) and stored in a memory 33. After a final sampling signal has been taken at an instant $t_e$, the central control means 45 deactivates the generators 19, 21 and 23, the sampling circuit 29, the control unit 37 and the analog-to-digital converter 31.

The sampled FID signal is and remains stored in the memory 33. Subsequently, a next measurement cycle is performed during which an FID signal is generated, sampled and stored in the memory 33. When a sufficient number of FID signals have been measured (the number of FID signals to be measured depends, for example on the desired resolution), an image is formed by means of a 2-D or 3-D Fourier transformation (this depends on the use of the gradient magnetic fields under whose effects the FID signals are generated and sampled).

FIG. 3 shows an example of a measurement cycle in accordance with the present state of the art which will be illustrated with reference to the device 15 shown in FIG. 2. Using the high-frequency coil 11, a 90° pulse P$_1$ is generated after the switching on of the main coils 1 which generate a steady, uniform magnetic field Bo. The resultant resonance signal F$_1$ is allowed to decay when using the spin echo technique and after a period of time $t_{v1}$ a 180° pulse P$_2$ is generated by the high-frequency coil 11. During a part of the period $t_{v1}$ a gradient field G$_x$ (denoted by a curve G$_1$) is generated for reasons described hereinafter. After a period of time $t_{v2}$, which is equal to $t_{v1}$, an echo resonance signal F$_2$ produced by the 180° pulse P$_2$ will reach a peak value. The use of the so-called spin echo technique (180° pulse P$_2$) prevents the occurrence of phase errors in the resonance signals produced by the spin nuclei; such phase errors are caused by non-uniformities in the steady magnetic field Bo. The echo resonance signal is sampled each time after a sampling interval $t_m$ in the presence of a gradient magnetic field G$_x$ which is denoted by a curve G$_2$.

It is known that the phase angle of a magnetization at a point x in a gradient magnetic field G$_x$ is determined by $t\int\gamma$ G$_x(\tau)\cdot$x$\cdot$d$\tau$. Thus, an image frequency $k_x$can be defined: $k_x=\int{}^t\gamma\cdot$G$_x(\tau)\cdot$d$\tau$. Thus, after each sampling period $t_m$ a respective signal sample will be determined which is associated with a different image frequency $k_x$. The successive image frequencies will exhibit an image frequency difference $\Delta k_x=\gamma\cdot\int t_m$G$_x\cdot(\tau)\cdot$d$\tau$. It will be apparent that when the described measurement cycle is repeated during which a further gradient field G$_y$ is applied for some time before sampling takes place, signal samples will be obtained which are associated with image frequency pairs ($k_x$, $k_y$). In the absence of a gradient magnetic field G$_y$, signal samples will thus be obtained which are associated with the image frequencies ($k_x$, O). It can be demonstrated that when a group of signal samples is collected which are associated with a matrix of image frequency pairs ($k_x$, $k_y$) in which the image frequencies range from $-k_x$ to $+k_x$ and from $-k_y$ to $+k_y$, a magnetization distribution can be determined in an x-y plane from this group of signal samples by means of a 2-D Fourier transformation. After expiration of a period of time T which comprises the measurement cycle started by the pulse P$_1$, a next measurement cycle is started with a similar measurement pulse P$_1'$ in order to take a new series of signal samples which are associated with image frequency pairs ($k_x$, $k_y$), in which $k_y$ is constant and predetermined, in that during the period $t_{v1}$ between the pulses P$_1'$ and P$_2'$ a gradient field G$_y$ (not shown) is applied in addition to a gradient field G$_1$. The period of time T elapsing between teh respective starts of two successive measurement cycles amounts to from 0.5 to 1 s in the methods in accordance to the present state of the art. A further reduction of this period of time will be at the expensive of the magnitude of the FID signal generated during the next measurement cycle, because a substantial proportion of the excited spin nuclei will have a comparatively long relaxation time with respect to such a shorter period of time. Only that proportion of the spin nuclei whose spin axes have relaxed back into the direction of the main fields Bo will then make a contribution to the spin echo signal.

FIG. 4 illustrates an embodiment of a measurement cycle of a method in accordance with the invention. This measurement cycle is substantially identical to the measurement cycle shown in FIG. 3. For the sake of clarity, FIG. 4 does not show gradient fields during the measurement period and shows only the relevant signals such as the excitation pulses P$_1$, P$_1'$, the 180° pulses P$_2$, P$_2'$ and the resonance signals F$_1$, F$_1'$, F$_2$, F$_2'$. Furthermore, in the successive measurement cycles (each having a duration T) the various (preparatory) gradient magnetic fields G$_1$, G$_1'$, G$_1''$ and the modulation M$_1$, M$_1''$ of the steady uniform magnetic field are shown. The successive measurement cycles differ from one another in the following respects: during every second measurement cycle the phase of the excited nuclear spins is alternated by the modulation M$_1$, M$_1''$ of the steady uniform magnetic field, and the intensity of the successive gradient fields G$_1$, G$_1'$, G$_1''$, . . . is step-wise increased. Due to the step-wise increase of the gradient field G$_1$, in each measurement cycle T adjacently situated rows of signal samples will be provided in the ($k_x$, $k_y$) image frequency matrix from the spin echo signal $F_2, F_2', F_2''$ occuring.

Due to the alternation of the phase of the excited nuclear spins, the phase of the spin echo signals $F_1, F_1', F_1''$ to be sampled will also alternate. The effect of alternating the phase of the nuclear spins on the spin echo signal can compensated for by inverting the values of every second row. Because the nature of the modulation $M_1, M_1''$ does not influence coherent interference signals, the contribution of such interference signals will have an alternating sign from one column to another in the image frequency matrix due to the inversion of the values in every second row. The undesirable contribution of, for example the off-set signal, will actually be raised from a frequency "O" to the highest feasible frequency in a column as determined by the sampling the orem; consequently, upon Fourier transformation it will be shifted to the edge (edges) of the transformed column in accordance with the already described point spread function.

Thusfar a method has been described in which the undesirable signal contributions alternate in phase from one row to another in the measured image frequency matrix, with the result that the artefacts in the image matrix are shifted to the edge thereof. However, signal contributions of alternating phase will not be required in all situations; the additional phase difference between the resonance signals associated with the successive rows (or planes) in the image frequency matrix has the value $\Delta\phi = (m-1)\cdot\pi/m$ in the optimum case, m being the number of rows ( or planes). For a proper understanding a description will now be given of a one-dimensional situation in which a signal is sampled equidistantly in time with a sampling interval $t_j$. The bandwidth Fw of the sampled signal is $Fw = 1/t_j$ after Fourier transformation, and the resolution (spacing of the frequencies) amounts to $\Delta f = 1/(NS \times t_j)$, in which NS is the number of signal samples taken. The highest frequency ($F_{max}$) occurring in the spectrum amounts to $F_{max} = (NS-1)\cdot\Delta f/2$ in the case of an even number of samples, and to $F_{max} = (NS-1)\cdot\Delta f/2$ in the case of an odd number of samples. The phase difference between two successive samples (for this highest frequency) will then be $\Delta\phi = 2\cdot\pi\cdot F_{max}\cdot t_j$. After substitution of $1/t_j = \Delta f \cdot NS$ in the formule for $F_{max}$ it follows that the phase difference amounts to $\Delta\phi = \pi$ when NS is even and to $\Delta\phi = (NS-1)\cdot\pi/NS$ when NS is odd.

FIG. 5 shows an example of a further method in accordance with the invention; the invention is now used for the so-called multiple-echo technique. After a 90° excitation pulse $P_1$, a plurality of nuclear magnetic resonance signals $F_{21}, F_{22}, F_{23}, \ldots$ are generated at intervals by means of 180° echo pulses $P_{21}, P_{22}, P_{23}, \ldots$. In practice the high-frequency electromagnetic echo pulses $P_{21}, P_{22}, \ldots$ will not be ideal; consequently the resonance signal $F_{21}, F_{22}, \ldots$ will contain contributions from nuclear spins which would not make such a contribution if the 180° pulses were perfect. The resonance signals are sampled, the signal samples of a first, second, third, fourth resonance signal $F_{21}, F_{22}, F_{23}, \ldots$ being stored in a first, second, third, fourth plane of an image frequency matrix.

After the 180° echo pulses $P_{21}$ to $P_{24}$, an additional phase shift is imparted to the nuclear spins by amplitude modulation of the steady, uniform magnetic field Bo as denoted in FIG. 5 by the pulse shapes $M_{21}, M_{22}, M_{23}$ and $M_{24}$. As a result, the resonance signals stored in the matrix will have a sign which alternates from one plane to another (for example, plane 1: positive; plane 2: negative; plane 3: positive; plane 4: negative, etc.). If the number of planes were odd, the total additional phase shift $\Delta\phi_{tot}$ in plane 4 would be (for example) $4\cdot\Delta\phi \bmod(2\pi)$.

After completion of the measurement cycle which started at the instant $t_N$, the next measurement cycle is started at the instant $t_{N+1}$; this measurement cycle is substantially identical to the preceding measurement cycle except for a preparatory gradient (omitted for the sake of clarity) and the modulation $M_1'$ of the steady uniform magnetic field which reverses the phase of the excited nuclear spins with respect to that of the nuclear spins excited during the preceding measurement cycle. The resonance signals $F_{21}', F_{22}', F_{23}', \ldots$ thus generated are sampled in the same way as during the preceding measurement cycle and the signal samples are stored in the planes of the matrix in the same way. By applying the step-like increment to the preparatory gradient field during each successive measurement cycle, the adjacently situated rows in each image frequency plane can be filled in successcion. Due to the additional modulation $M_1'$ which causes the phase of the resonance signals to alternate from one measurement cycle to another, the coherent interference signals generated by the non-ideal 180° reversing pulses will be stored in a plane with the same sign from one row to the next. Furthermore, the modulations $M_{21}, M_{22}, \ldots$ and $M_{21}', M_{22}', \ldots$ reverse the phase of the resonance signals generated, so that they are stored in the planes of the three-dimensional matrix with a sign which alternates from one plane to the next; thus, the interference signals present in the resonance signals have not been influenced by the modulation of the uniform magnetic field and are invariably stored as if it were with the same sign. When the sign of the signal samples of the even rows in a plane is reversed and the sign of the signal samples of the odd rows is reversed in the (two) neighbouring plane (planes), the interference signals will have an alternating sign from one plane to the next and from one row to the next in a plane (in the case of even number of rows and an even number of planes), so that they will actually have a highest signal frequency. Consequently, after Fourier transformation of the image frequency matrix, the interference signals will cause artefacts only at an edge in an image matrix (or at two edges as described above).

The introduction of an additional phase difference $\Delta\phi$ between two resonance signals can be realized in various ways. As is shown in FIG. 1 and 2, the steady uniform magnetic field Bo is generated by means of a coil system 1 which is powered by a current generator 17. By applying an amplitude modulated signal $I_{mod}$ to an output amplifier 58 of the current generator 17, in addition to the control signal $I_o$ for generating a magnetic field Bo, the coil is controlled (see FIG. 6) by a current $I_{tot} = I_o + I_{mod}$. The total field B generated will then be a superposition of the steady field Bo and a time-modulated field, and hence an amplitude-modulated uniform field.

A further possibility of generating an amplitude-modulated field consists in the use of shim coils $1b$ which serve to impart a very high uniformity to the steady field. For the sake of clarity, these shim coils $1b$ have been omitted in FIG. 1, but in practice they are situated parallel to the coils 1 and they may also have the same shape. FIG. 7 also shows the amplifier 58 and the coil 1 of FIG. 6; these elements receive the current $I_o$ and generate the magnetic field $B_o$, respectively. Only one of the shim coils $1b$ is shown, said coil being powered by a current generator 59 (each of the various shim coils is separately powered in order to enable adequate adjustment). On the shim current $I_{shim}$ there is superposed a modulation current $I_{mod}$ (which may be different for the various shim coils), so that a time-modulated uniform magnetic field is superposed on the main magnetic field $B_o$.

FIG. 8 illustrates a further possibility of generating an amplitude-modulated uniform magnetic field, i.e. the use of gradient coils. In the present example use is made of the z-gradient coils $3a$, $3b$. Use can alternatively be made of the x-gradient coils 5 or the y-gradient coils 7. The gradient coils $3a$ and $3b$ are powered by a current generator 19 (see FIG. 2) which for this purpose includes output amplifiers 60 and 61 which receive a gradient current signal $I_{grad}$ and which generate output currents on their outputs 62 and 63 which are oppositely directed with respect to each other as indicated by arrows ($+I_p$ and $-I_n$) in FIG. 8. The gradient current signal $I_{grad}$ is applied to the negative input of the amplifier 61 and to the positive input of the amplifier 60. In order to generate an amplitude-modulated uniform field, a modulation current signal $I_{mod}''$ is applied to a positive input of both amplifiers 60, 61. The current through the coil $3a$ is thus increased and the current through the coil $3b$ is decreased. The gradient coil system $3a$, $3b$ then generates (in addition to a gradient field) a (weak) time-modulated uniform magnetic field which constitutes an amplitude-modulated uniform magnetic field in conjunction with the magnetic field $B_o$ generated by the coils 1.

A method in accordance with the invention can be advantageously, used in what is called rotating frame spectroscopy. In accordance with the invention a method of rotating frame spectroscopy for determining a nuclear magnetic resonance distribution in a region of a body which is situated in a steady, uniform magnetic field, includes the steps of (a) generating a high-frequency electromagnetic pulse in order to cause a precessional motion of the magnetization of nuclei in the body, thus generating a resonance signal, (b) then after a preparation period taking a number of signal samples of the resonance signal during a measurement period, (c) then repeating a measurement cycle comprising the steps (a) and (b) for a second number of repetitions in order to provide a set of signal samples in a matrix consisting of (m) rows and (n) columns, per measurement cycle there being filled at least one row, from which, after Fourier transformation thereof, an image of the distribution of the induced nuclear magnetization is determined, and is characterized in that during a plurality of measurement cycles the steady, uniform magnetic field is amplitude modulated, such that between the resonance signals associated with the various rows in the matrix which succeed one another with respect to the value of the integral of the intensity of the gradient field over the preparation period, there is each time introduced the same additional phase difference ($\Delta\phi$), the additional phase differences ($\Delta\phi$) thus introduced being cancelled before Fourier transformation of values present in columns of the matrix.

What is claimed is:

1. A method of determining a nuclear magnetic resonance distribution in a region of a body which is situated in a generated, steady, uniform magnetic field, including the steps of (a) generating a high-frequency electromagnetic pulse in order to cause a precessional motion of the magnetization of nuclei in the body, thus generating a resonance signal, (b) then applying at least one gradient magnetic field during a preparation period, (c) then taking a first number of signal samples of the resonance signal during a measurement period, (d) then repeating a measurement cycle comprising the steps (a), (b) and (c) for a second number of repetitions, the integral of the intensity of at least one gradient field over the preparation period having a different value at each repetition in order to provide a set of signal samples in a matrix consisting of (m) rows and (n) columns, per measurement cycle there being filled at least one row, from which, after Fourier transformation thereof, an image of the distribution of the induced nuclear magnetization is determined, characterized in that during a plurality of measurement cycles the steady, uniform magnetic field is amplitude modulated, such that between the resonance signals associated with the various rows in the matrix which succeed one another with respect to the value of the integral of the intensity of the gradient field over the preparation period, there is each time introduced the same additional phase difference ($\Delta\phi$), the additional phase differences ($\Delta\phi$) thus introduced being cancelled before Fourier transformation of values present in columns of the matrix.

2. A method as claimed in claim 1, characterized in that the additional phase difference ($\Delta\phi$) is equal to $\pi\cdot(m-1)/m$ rad/sec, in which m is odd and represents the number of rows of the matrix.

3. A method as claimed in claim 1 characterized in that the number of rows (m) of the matrix is even, the phase difference ($\Delta\phi$) being equal to $\pi$ rad/sec, before Fourier transformation of the values present in columns of the matrix either values present in the even rows or values present in the odd rows being inverted in order to cancel the additional phase difference.

4. A method as claimed in claim 3, in which the value of the integral of the intensity of the gradient field over the preparation period is incremented by the same amount for each subsequent measurement cycle, characterized in that during successive measurement cycles the excited nuclear spins are subjected to a phase shift ($\Delta\phi$) which changes its sign per cycle.

5. A method as claimed in claim 3 or 4, characterized in that the excited nuclear spins are subjected to a phase shift ($\Delta\phi$) of $\pi/2$ rad/sec or substantially $\pi/2$ rad/sec.

6. A method as claimed in claim 1, 2 or 3, in which the value of the integral of the intensity of the gradient field over the preparation period is incremented by the same amount for each subsequent measurement cycle, characterized in that said nuclear spins are subjected to a phase shift of $\pi$ rad/sec or substantially $\pi$ rad/sec only during every second measurement cycle.

7. A method of determining a nuclear magnetic resonance distribution in a three-dimensional region of a body which is situated in a generated, steady, uniform magnetic field, including the steps of:

(a) generating a high-frequency electromagnetic pulse in order to cause a precessional motion of the magnetization of nuclei in the body, thus generating a resonance signal, (b) then applying, during a preparation period, at least a first and a second preparatory gradient magnetic field whose field directions are mutually perpendicular, (c) then taking, during a measurement period, a set of signal samples of the resonance signal, (d) then repeating a measurement cycle comprising the steps (a), (b) and (c) for a plurality of repetitions, a first integral which comprises the integral of the intensity of the first gradient field over the preparation period having a first number of different values whilst a second integral which comprises the integral of the intensity of the second gradient field over the preparation period has a second number of different values in order to provide a set of signal samples in a three-dimensional matrix which consists of lines, rows and columns, one plane thereof containing rows and columns, per measurement cycle at least one row of a plane being filled, from said matrix there being determined, after Fourier transformation thereof, an image of the distribution of the induced nuclear magnetization in a three-dimensional region of a body, characterized in that during several measurement cycles the steady, uniform magnetic field is amplitude-modulated such that between the resonance signals associated with the different planes in the matrix which succeed one another with respect to the value of the integral of the density of the first gradient field over the preparation period and between the resonance signals associated with the different rows in plane of the matrix which succeed one another with respect to the value of the integral of the intensity of the second gradient field over the preparation period there is invariably introduced a first and a second additional phase difference ($\Delta\phi_1$, $\Delta\phi_2$), the introduced first and second additional phase differences ($\Delta\phi_1$, $\Delta\phi_2$) being cancelled before Fourier transformation of values present in columns or lines of the matrix.

8. A method as claimed in claim 7, characterized in that the first additional phase difference ($\Delta\phi_1$) is equal to $\pi(1-1)/1$ rad/sec, 1 being odd and representing the number of planes of the matrix.

9. A method as claimed in claim 7 or 8, characterized in that the second additional phase difference ($\Delta\phi_2$) is equal to $\pi(m-1)/m$ rad/sec, m being odd and representing the number of rows in a plane of the matrix.

10. A method as claimed in claim 7, characterized in that the number of planes (l) of the matrix is even, the first phase difference ($\Delta\phi_1$) being equal to $\pi$ rad/sec, before Fourier transformation of the values present in a line of the matrix either the values present in the even planes or the values present in the odd planes of the relevant line being inverted in order to cancel the first additional phase difference ($\Delta\phi_1$).

11. A method as claimed in claim 7 or 10, characterized in that the number of rows (m) in a plane is even, the second additional phase difference ($\Delta\phi_2$) being equal to $\pi$ rad/sec, before Fourier transformation of the values present in columns of a plane either the values present in the even rows or the values present in the odd rows of the relevant column being inverted in order to cancel the second additional phase difference ($\Delta\phi_2$).

12. A method as claimed in claim 7, 10 or 11, in which the first integral invariably remains constant for a number of measurement cycles (m) after the same change of value, said second integral invariably assuming a different value which is bounded by two extreme values and step-wise changing over from one extreme value to the other extreme value, characterized in that the number of planes (l) and the number of rows (m) are even, the total amount of the additional phase differences between the resonance signals associated with the even rows in the even planes and with the odd rows in the odd planes and the resonance signals associated with the odd rows in the even planes and with the even rows in the odd planes being $\pi$ rad/sec, the additional phase difference being cancelled by inverting the values either in the even rows of the even planes and the odd rows of the odd planes or in the odd rows of the even planes and the even rows of the odd planes.

13. A method as claimed in claim 5 or 12, characterized in that the intensity of the steady, uniform magnetic field during the successive measurement cycles is successively increased and decreased during a part of the preparation period, so that the integral of the increase and the decrease over the preparation period amounts to $+\pi/2$ rad/sec and $-\pi/2$ rad/sec, respectively.

14. A device for determining the nuclear magnetic resonance distribution in a region of a body, comprising (a) means for generating a steady, uniform magnetic field, (b) means for generating a high-frequency electromagnetic radiation, (c) means for generating at least one gradient magnetic field, (d) sampling means for sampling a resonance signal generated by the means specified in paragraphs (a) and (b), after conditioning the resonance signal by means of at least one gradient magnetic field generated by the means specified in paragraph (c), (e) processing means for processing the signals provided by the sampling means, and (f) control means for controlling at least the means specified in paragraphs (b) to (e) for generating, conditioning, sampling and processing a plurality of resonance signals, each resonance signal being respectively conditioned during a preparation period, the control means supplying the means specified in paragraph (c) with control signals for adjusting the intensity and/or the duration of at least one gradient magnetic field, the integral of the intensity over the duration of at least one gradient magnetic field being different for each preparation period, characterized in that the device includes further means for generating an amplitude-modulated uniform magnetic field, the control means including programmed computer means for generating an amplitude-modulated uniform magnetic field.

15. A device as claimed in claim 14, in which the means for generating a steady, uniform magnetic field include a coil system, characterized in that the further means modulate the current intensity through the coil system during a preparation period.

16. A device as claimed in claim 14, characterized in that the further means include a further coil system.

17. A device as claimed in claim 14, in which the means for generating a gradient field include a gradient coil system having at least one coil pair, characterized in that the further means are connected to the gradient coil system so that the further means change a current through a coil of the coil pair in the opposite sense with respect to the current through the other coil of the coil pair.

18. A method of determining a nuclear magnetic resonance distribution in a region of a body which is situated in a generated, steady, uniform magnetic field, including the steps of
   (a) generating a high-frequency electromagnetic pulse in order to cause a precessional motion of the magnetization of nuclei in the body, thus generating a resonance signal,
   (b) then after a preparation period taking a number of signal samples of the resonance signal during a measurement period,
   (c) then repeating a measurement cycle comprising the steps (a) and (b) for a second number of repetitions in order to provide a set of signal samples in a matrix consisting of (m) rows and (n) columns, per measurement cycle there being filled at least one row, from which, after Fourier transformation thereof, an image of the distribution of the induced nuclear magnetization is determined, characterized in that during a plurality of measurement cycles the steady, uniform magnetic field is amplitude modulated, such that between the resonance signals associated with the various rows in the matrix which succeed one another with respect to the value of the integral of the intensity of the gradient field over the preparation period, there is each time introduced the same additional phase difference ($\Delta\phi$), the additional phase difference ($\Delta\phi$) thus introduced being cancelled before Fourier transformation of values present in columns of the matrix.

* * * * *